US011282888B1

(12) United States Patent
Lim

(10) Patent No.: US 11,282,888 B1
(45) Date of Patent: Mar. 22, 2022

(54) SCHEME OF BOOSTING ADJUSTABLE GROUND LEVEL(S) OF STORAGE CAPACITOR(S) OF BJT PIXEL CIRCUIT(S) IN PIXEL ARRAY CIRCUIT OF IMAGE SENSOR APPARATUS

(71) Applicant: PixArt Imaging Inc., Hsin-Chu (TW)

(72) Inventor: Wooi Kip Lim, Penang (MY)

(73) Assignee: Pix Art Imaging Inc., Hsin-Chu (TW)

( * ) Notice: Subject to any disclaimer, the term of this patent is extended or adjusted under 35 U.S.C. 154(b) by 0 days.

(21) Appl. No.: 17/002,800

(22) Filed: Aug. 26, 2020

(51) Int. Cl.
*H01L 27/146* (2006.01)
*H04N 5/235* (2006.01)
*H04N 5/3745* (2011.01)

(52) U.S. Cl.
CPC ..... *H01L 27/14681* (2013.01); *H04N 5/2353* (2013.01); *H04N 5/37452* (2013.01)

(58) Field of Classification Search
CPC ............ H01L 27/14681; H04N 5/2353; H04N 5/37452
See application file for complete search history.

(56) References Cited

U.S. PATENT DOCUMENTS

| | | | | |
|---|---|---|---|---|
| 6,037,643 A * | 3/2000 | Knee | ................ | H01L 27/14603 257/231 |
| 6,512,544 B1 * | 1/2003 | Merrill | ............... | H04N 5/35527 348/302 |
| 2007/0023798 A1 * | 2/2007 | McKee | ............. | H01L 27/14609 257/291 |
| 2007/0051988 A1 * | 3/2007 | Koga | ..................... | H04N 5/335 257/239 |
| 2007/0091191 A1 * | 4/2007 | Oike | ...................... | H04N 5/357 348/294 |
| 2008/0099806 A1 * | 5/2008 | Kang | ................. | H01L 27/14681 257/292 |
| 2012/0153123 A1 * | 6/2012 | Mao | ................... | H04N 5/37452 250/208.1 |
| 2013/0141619 A1 * | 6/2013 | Lim | ..................... | H04N 5/3559 348/302 |
| 2016/0111461 A1 * | 4/2016 | Ahn | .................. | H01L 27/14612 250/208.1 |
| 2016/0316163 A1 * | 10/2016 | Beck | ..................... | H04N 5/3559 |

* cited by examiner

Primary Examiner — Jason A Flohre
(74) Attorney, Agent, or Firm — Winston Hsu

(57) ABSTRACT

A bipolar junction transistor (BJT) pixel circuit, including: a BJT transistor, having a base coupled to a photo detector, an emitter coupled to a shutter circuit, and a collector coupled to a reference ground level; the photo detector, having first end coupled to the base of BJT transistor and second end coupled to the reference ground level, for generating base current based on light intensity of light incident on the photo detector; the shutter circuit, coupled to the emitter of the BJT transistor, for controlling exposure time of the photo detector according to a shutter signal; and a storage capacitor, coupled between the shutter circuit and an adjustable ground level different from the reference ground level, for storing image data captured by the photo detector, wherein the adjustable ground level is boosted to be higher than the reference ground level for one or more times during the exposure time.

12 Claims, 4 Drawing Sheets

SCHEME OF BOOSTING ADJUSTABLE GROUND LEVEL(S) OF STORAGE CAPACITOR(S) OF BJT PIXEL CIRCUIT(S) IN PIXEL ARRAY CIRCUIT OF IMAGE SENSOR APPARATUS

BACKGROUND OF THE INVENTION

1. Field of the Invention

The invention relates to bipolar junction transistor pixel circuit, and more particularly to a bipolar junction transistor pixel circuit, a pixel array circuit, and an image sensor apparatus thereof.

2. Description of the Prior Art

Generally speaking, the performance of a conventional optical tracking system using a pixel circuit having a photo detector structure to sense the energy of the incident light to capture image data is limited by the environment light, the turn-on period of a shutter, or other factors associated with light source since the voltage of a storage capacitor of the pixel circuit easily becomes saturated in a situation of a higher light intensity when the storage capacitor is discharged. The quality of image contrast will be unavoidably degraded due to the voltage saturation, and thus the performance of optical tracking is worse.

SUMMARY OF THE INVENTION

Therefore one of the objectives of the invention is to provide a bipolar junction transistor (BJT) pixel circuit, a pixel array circuit, and an image sensor apparatus thereof, to solve the above-mentioned problems.

According to embodiments of the invention, a BJT pixel circuit is disclosed. The BJT pixel circuit comprises a BJT transistor, a photo detector, a shutter circuit, and a storage capacitor. The BJT transistor has a base coupled to a photo detector, an emitter coupled to a shutter circuit, and a collector coupled to a reference ground level. The photo detector has a first end coupled to the base of the BJT transistor and a second end coupled to the reference ground level, and it is used for generating a base current based on a light intensity of a light incident on the photo detector. The shutter circuit is coupled to the emitter of the BJT transistor, and it is used for controlling an exposure time of the photo detector according to a shutter signal. The storage capacitor is coupled between the shutter circuit and an adjustable ground level different from the reference ground level, and it is used for storing image data captured by the photo detector, wherein the adjustable ground level is boosted to be higher than the reference ground level for one or more times during the exposure time.

According to the embodiments, a pixel array circuit comprising a plurality of BJT pixel circuits as described above is disclosed. The plurality of BJT pixel circuits at least comprise a first BJT pixel circuit and a second BJT pixel circuit. Both a first adjustable ground level corresponding to a first storage capacitor within the first BJT pixel circuit and a second adjustable ground level corresponding to a second storage capacitor within the second BJT pixel circuit are boosted by a first voltage difference during the exposure time. The first voltage difference is associated with the second BJT pixel circuit when a light intensity of a light incident on a second photo detector of the second BJT pixel circuit is lower than a light intensity of a light incident on a first photo detector of the first BJT pixel circuit.

According to the embodiments, an image sensor apparatus is disclosed. The image sensor apparatus comprising a pixel array circuit and a controlling circuit. The pixel array circuit comprises a plurality of BJT pixel circuits each comprising a BJT transistor, a photo detector, a shutter circuit, and a storage capacitor. The BJT transistor has a base coupled to a photo detector, an emitter coupled to a shutter circuit, and a collector coupled to a reference ground level. The photo detector has a first end coupled to the base of the BJT transistor and a second end coupled to the reference ground level, for generating a base current based on a light intensity of a light incident on the photo detector. The shutter circuit is coupled to the emitter of the BJT transistor, and it is used for controlling an exposure time of the photo detector according to a shutter signal. The storage capacitor is coupled between the shutter circuit and an adjustable ground level different from the reference ground level, and is used for storing image data captured by the photo detector. The controlling circuit is coupled to the pixel array circuit, and is used for dynamically adjusting the adjustable ground level of the each BJT pixel circuit for one or more times during the exposure time, wherein the adjustable ground level is boosted to be higher than the reference ground level.

According to the embodiments, the image contrast of the BJT pixel units is significantly improved and thus the image quality is better. The tracking performance of the image sensor apparatus when applied to an optical tracking device/system is better compared to the conventional optical tracking device/system.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
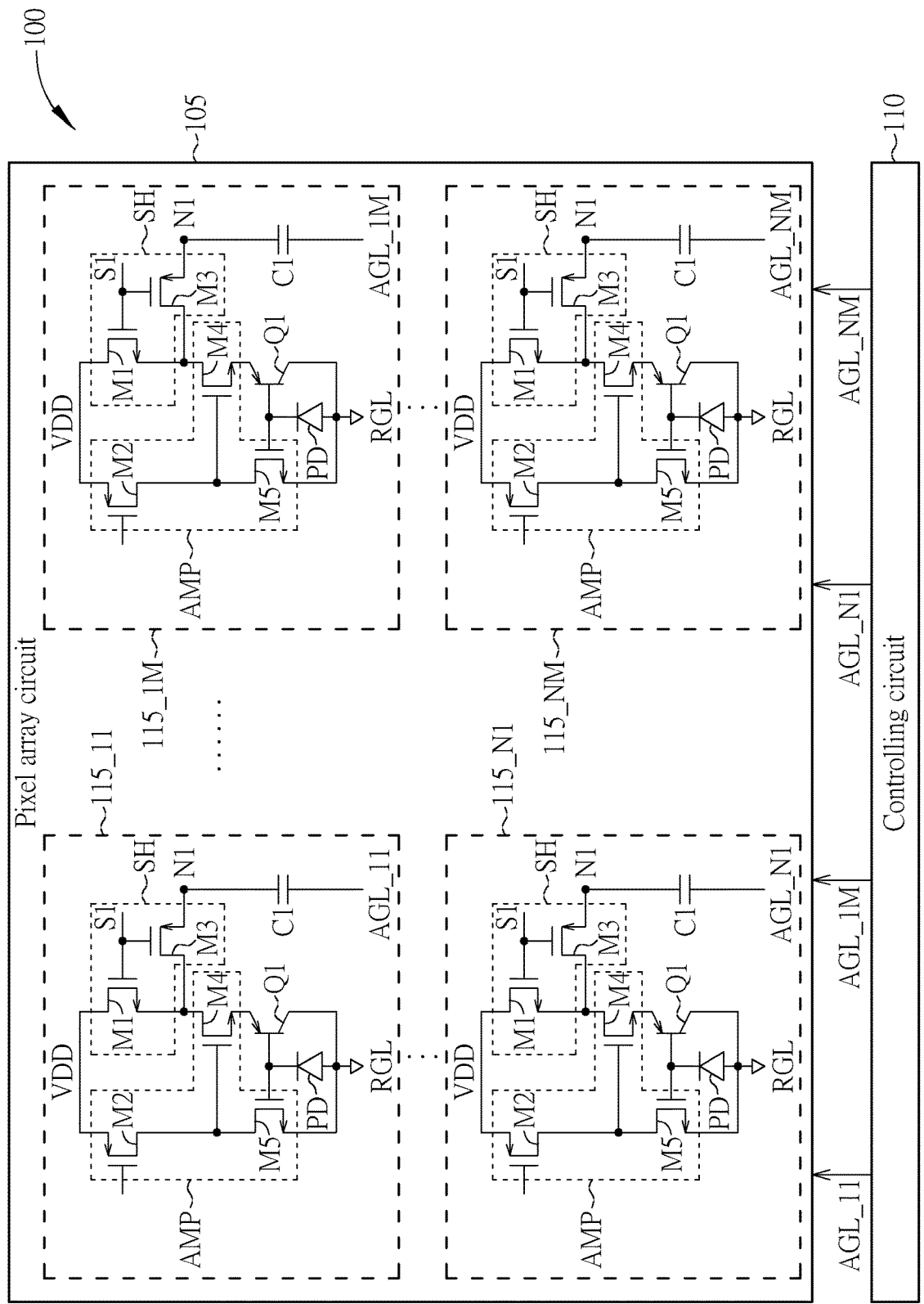
FIG. 1 is a diagram of an image sensor apparatus according to an embodiment of the invention.

FIG. 1 is a diagram of an image sensor apparatus 100 according to an embodiment of the invention. The image sensor apparatus 100 is used for capturing image data of an illuminated navigation surface and comprises a pixel array circuit 105 and a controlling circuit 110. The pixel array circuit 105 comprises a plurality of bipolar junction transistor (BJT) pixel circuits 115_11, ..., 115_1M, ..., 115N1, ..., and 115_NM, i.e. N×M BJT pixel circuits respectively corresponding to different pixel units spatially disposed on in a frame wherein the numbers of N and M are not limited.

Each BJT pixel circuit (e.g. 115_11, but not limited) at least comprises a photo detector PD such as a photodiode, a BJT transistor Q1, a shutter circuit SH, an amplifier circuit AMP, and a storage capacitor C1. For example, in this example, the shutter circuit SH comprises the transistors M1 and M3. The amplifier circuit AMP comprises transistors M2, M4, and M5. The storage capacitor C1 is used for storing image data captured by the photo detector PD.

In each BJT pixel circuit, the BJT transistor Q1 has a base coupled to the photo detector PD, an emitter coupled to the shutter circuit SH, and a collector coupled to a reference ground level RGL. The photo detector PD has a first end coupled to the base of the BJT transistor Q1 and a second end coupled to the reference ground level RGL such as equivalent zero volts (but not limited), and is used for generating a base current based on a light intensity of a light incident on the photo detector PD. The shutter circuit SH is coupled to the emitter of the BJT transistor Q1, and is used for controlling an exposure time of the photo detector PD according to a shutter signal S1 which can also be generated by the controlling circuit 110 (but not limited). The storage capacitor C1 is coupled between the shutter circuit SH and an adjustable ground level (e.g. AGL_11 for the BJT pixel circuit 115_11; but not limited) identical to or different from the reference ground level RGL, and is used for storing image data captured by the photo detector PD. The adjustable ground levels such as AGL_11, ..., AGL_1M, ..., AGL_N1, ..., and AGL_NM of different BJT pixel circuits may be identical or may be different from each other.

The controlling circuit 110 is coupled to the pixel array circuit 105, and is used for dynamically and continuously/discontinuously adjusting the adjustable ground levels AGL_11, ..., AGL_1M, ..., AGL_N1, ..., and AGL_NM of the BJT pixel circuits 115_11, ..., 115_1M, ..., 115N1, ..., and 115_NM for one or more times during the exposure time, wherein the adjustable ground levels AGL_11, ..., AGL_1M, ..., AGL_N1, ..., and AGL_NM are boosted to be higher than the reference ground level RGL (but not limited).

For each BJT pixel circuit, at start of each frame, a light source (not shown) is pulsed on with a light control signal to generate a reflect light shone on the photo detector PD. The photo detector PD generates a base current flowing from the base of the BJT transistor Q1 into the reference ground level RGL in response to the light intensity of a light illuminated from a light source. Then, the amplifier circuit AMP begins to build up a voltage drop across the emitter and the base of the BJT transistor Q1 to increase the beta of the BJT transistor Q1 to a stable level, wherein the beta herein is the ratio between the collector current and the base current of the BJT transistor Q1. Then, the BJT transistor Q1 operates with a stable beta and generates a stable emitter current. The shutter circuit SH is triggered on at the same time by a shutter signal S1 of the each BJT pixel circuit so that the storage capacitor C1 can be discharged with the stable emitter current IE to capture the image data of the each pixel unit to generate a pixel value (i.e. an light measurement value) of the each pixel unit, e.g. a brightness value (i.e. gray level or gray scale, but not limited). When the shutter circuit SH is triggered on, the voltage drop across the storage capacitor C1 decreases with the emitter current as the storage capacitor C1 discharges through BJT transistor Q1 with the emitter current. The current amount of the emitter current of BJT transistor Q1 is substantially proportional to the intensity/magnitude of the reflect light shone on the photo detector PD, and accordingly the voltage level at the terminal N1 of the storage capacitor C1 may decrease fast or slowly with the different intensity/magnitude of the reflect light shone on the photo detector PD.

In one embodiment, for example, the reference ground level RGL may be equal to equivalent zero volts, and the voltage VDD is equal to 1.8 Volts; this is not meant to be a limitation. That is, the ideal full scale voltage range is from 1.8 Volts to 0 Volts. However, based on the circuit structure of each BJT pixel circuit, actually, the minimum voltage level at the terminal N1 of the storage capacitor C1 after the energy of the storage capacitor C1 has been completely discharged may be not equal to zero. For example, the actual full scale range of the voltage level at the terminal N1 of the storage capacitor C1 may be from 1.8 Volts to a voltage level slightly higher than zero, e.g. 0.9 Volts (but not limited). That is, when the shutter circuit SH is triggered on, if the intensity or magnitude of the reflected light is too high (e.g. due to the high-intensity light environment), then the voltage level at the terminal N1 of the storage capacitor C1 may be rapidly discharged and become saturated at 0.9 Volts. The discrimination between different pixel values corresponding to different light intensity may be affected and become smaller due to that the voltage level(s) at storage capacitor(s) becomes saturated.

To solve the problems, in one embodiment, the controlling circuit 110 is arranged to generate a statistic light intensity result of a portion or all of the BJT pixel circuits of pixel units within the pixel array circuit 115 by detecting the light intensity of pixel units respectively in one or more reference frames such as previous data frames or training frames if the image sensor apparatus 100 includes a data mode and a training mode. Then, the controlling circuit 110 is arranged to boost the different adjustable ground level(s) of the different BJT pixel circuit(s) according to the maximum light intensity of the reflected light shone on the photo detector PD of a BJT pixel circuit among all the BJT pixel circuits (i.e. global maximum light intensity) or according to the maximum light intensity of the reflected light shone on (e.g. light incident on) the photo detector PD of a BJT pixel circuit within a specific spatial portion/region/area of the pixel array circuit 105 (i.e. local maximum light intensity).

Figure 2:
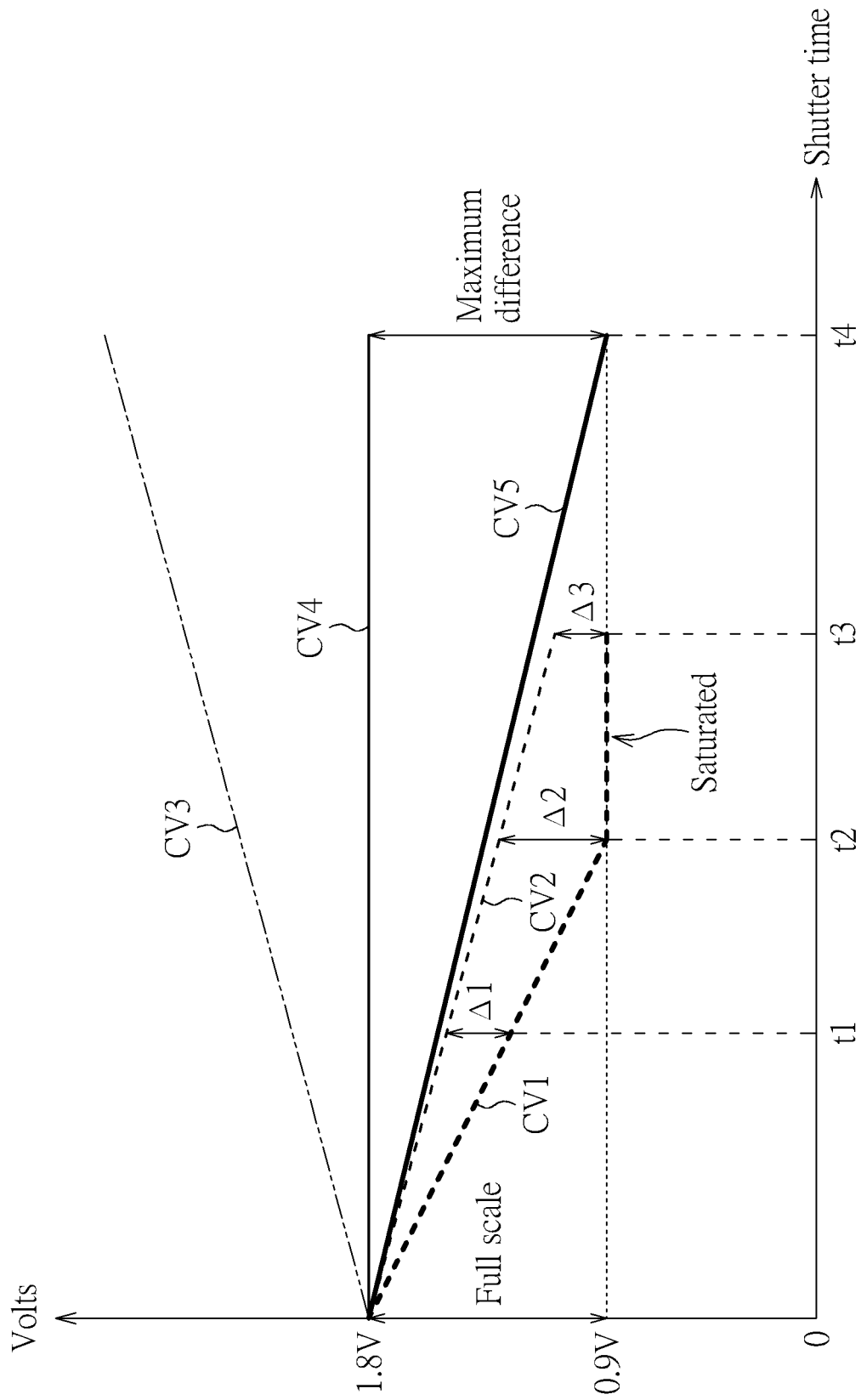
FIG. 2 is a diagram illustrating the relation between the different voltage level changes of the storage capacitors C1 with and without boosting the adjustable ground level for the reflected light having local/global maximum light intensity and the relation between voltage level of the storage capacitors C1 with and without boosting the adjustable ground level for the reflected light having local/global minimum light intensity according to the embodiment of image sensor apparatus of FIG. 1.

FIG. 2 is a diagram illustrating the relation between the different voltage level changes of the storage capacitors C1 with and without boosting the adjustable ground level for the reflected light having local/global maximum light intensity and the relation between voltage level of the storage capacitors C1 with and without boosting the adjustable ground level for the reflected light having local/global minimum light intensity according to the embodiment of image sensor apparatus 100 of FIG. 1. As shown in FIG. 2, for example, a first photo detector PD of a first BJT pixel circuit (e.g. 115_11, but not limited) is illuminated by the reflected light with local/global maximum light intensity, and a second photo detector PD of a second BJT pixel circuit (e.g. 115_NM, but not limited) is illuminated by the reflected light with local/global minimum light intensity. The shutter time means the turn-on period of the shutter circuit SH and for example is from zero to time t4 (but not limited). The curve CV1 represents an example of the voltage level at the terminal N1 of the storage capacitor C1 of the first BJT pixel circuit without boosting the adjustable ground level of the first storage capacitor C1, so such voltage level at the terminal N1 of the storage capacitor C1 of the first BJT pixel circuit is rapidly discharged from level 1.8 Volts and for example becomes saturated at 0.9 Volts at time t2. The curve CV2 represents an example of the voltage level at the terminal N1 of the storage capacitor C1 of the second BJT pixel circuit without boosting the adjustable ground level of the storage capacitor C1 of the second BJT pixel circuit, so such voltage level at the terminal N1 of the storage capacitor C1 of the second BJT pixel circuit is slowly discharged from 1.8 Volts and is not saturated at 0.9 Volts for either time t2 or time t3.

As shown in FIG. 2, at time t1, the voltage difference between the voltage levels at terminals N1 of the storage capacitors C1 is equal to Δ1, and becomes Δ2 at time t2 wherein Δ2 is larger than Δ1; however, the voltage difference gradually becomes smaller after time t2. For instance, the voltage difference Δ3 at time t3 may be smaller than the voltage difference Δ1 at time t1, and at time t4 the voltage difference may become zero. Thus, without boosting the adjustable ground level(s) of the storage capacitor(s) C1 of BJT pixel circuit(s), the performance of image contrast quality of one or more frames may be poor or degraded once the turn-on period(s) of the shutter circuit(s) is/are longer, the light intensity of reflected light is too high, or the light intensity of reflected light changes.

To improve the performance of image contrast quality, one or more adjustable ground levels of one or more storage capacitors C1 of one or more BJT pixel circuits is/are adjusted or boosted continuously or discontinuously. The controlling circuit 110 is arranged to boost the adjustable ground level(s) of BJT pixel circuit(s) of BJT pixel unit(s) disposed in at least one specific spatial region/portion/area of a frame with a specific voltage difference which may be determined by the controlling circuit 110 based on a voltage level change at the terminal N1 of the storage capacitor C1 of a BJT pixel unit that is illuminated by the reflected light having a minimum magnitude for one frame or for more frames (i.e. instantly or averagely). That is, for the BJT pixel circuit(s) of BJT pixel unit(s) disposed in the at least one specific spatial region/portion/area of the frame, the controlling circuit 110 may use and adjust the same voltage level as the corresponding adjustable ground level(s). In addition, in practice, the controlling circuit 11 can detect the pixel values (i.e. brightness values) of the above-mentioned BJT pixel units for one frame or for multiple frames to determine a BJT pixel unit having a local/global minimum brightness value for one frame (or for more frames) so as to determine a voltage adjustment amount for the adjustable ground levels according to the voltage level change at the node N1 of the storage capacitor C1 of such BJT pixel unit. Similarly, the controlling circuit 110 can also boost the adjustable ground levels of BJT pixel circuits of all BJT pixel units disposed in a frame with a specific voltage difference which may be determined by the controlling circuit 110 based on a voltage level change at the terminal N1 of the storage capacitor C1 of a BJT pixel unit that is illuminated by the reflected light having a minimum magnitude for one frame or for more frames (i.e. instantly or averagely).

Refer to FIG. 2 again. The curve CV1 and the curve CV2 respectively correspond to the example of the voltage level at the terminal N1 of the storage capacitor C1 of the first BJT pixel circuit which is illuminated by the reflected light having the global/local maximum light intensity without boosting the adjustable ground level for the first storage capacitor C1 and the example of the voltage level at the terminal N1 of the storage capacitor C1 of the second BJT pixel circuit which is illuminated by the reflected light having the global/local minimum light intensity without boosting the adjustable ground level for the storage capacitor C1 of the second BJT pixel circuit. The curve Cv3 represents an example of the adjustable ground levels determined and outputted by the controlling circuit 110 for BJT pixel unit(s) disposed in at least one spatial region/portion/area of a frame according to the minimum pixel value (or brightness value) of the pixel value(s) of the BJT pixel unit(s). in this example, the controlling circuit 110 can be arranged to continuously and gradually adjust or increase the adjustable ground levels with the shutter time, and CV3 indicates that the adjustable ground levels of storage capacitors of BJT pixel units are increased gradually with time so that the voltage level at the terminal N1 of the storage capacitor C1 of the BJT pixel unit illuminated by the reflected light having the global/local minimum light intensity is substantially kept (but not limited) at the level of 1.8 Volts for example (as shown by the curve CV4), and the voltage level at the terminal N1 of the storage capacitor C1 of the BJT pixel unit illuminated by the reflected light having the global/local maximum light intensity becomes slowly decreases with time as shown by the curve CV5 (compared to curve CV1); for the same condition of global/local maximum light intensity, the slope of curve CV5 is different from that of curve CV1. Accordingly, at time t4, the voltage difference between the levels at the terminals N1 of the storage capacitors C1 of the two BJT pixel units respectively illuminated by the reflected light having minimum and maximum light intensities becomes a maximum difference if the shutter circuits SH of the two BJT pixel units are turned off at time t4. Accordingly, since the voltage level of the storage capacitor C1 of the BJT pixel unit is not saturated during the turn-on period of the shutter circuit SH even though such BJT pixel unit is illuminated by the reflected light having a higher or maximum light intensity, the performance of image contrast quality of the image sensor apparatus 100 is not degraded due to the higher or maximum light intensity and can be significantly improved.

Further, in one embodiment, the controlling circuit 110 can be arranged to discontinuously adjust the adjustable ground levels of the storage capacitors C1 of BJT pixel circuits of pixel units disposed in at least one spatial region/portion/area of a frame or can discontinuously adjust the adjustable ground levels of the storage capacitors C1 of BJT pixel circuits of all pixel units disposed in a frame.

Figure 3:
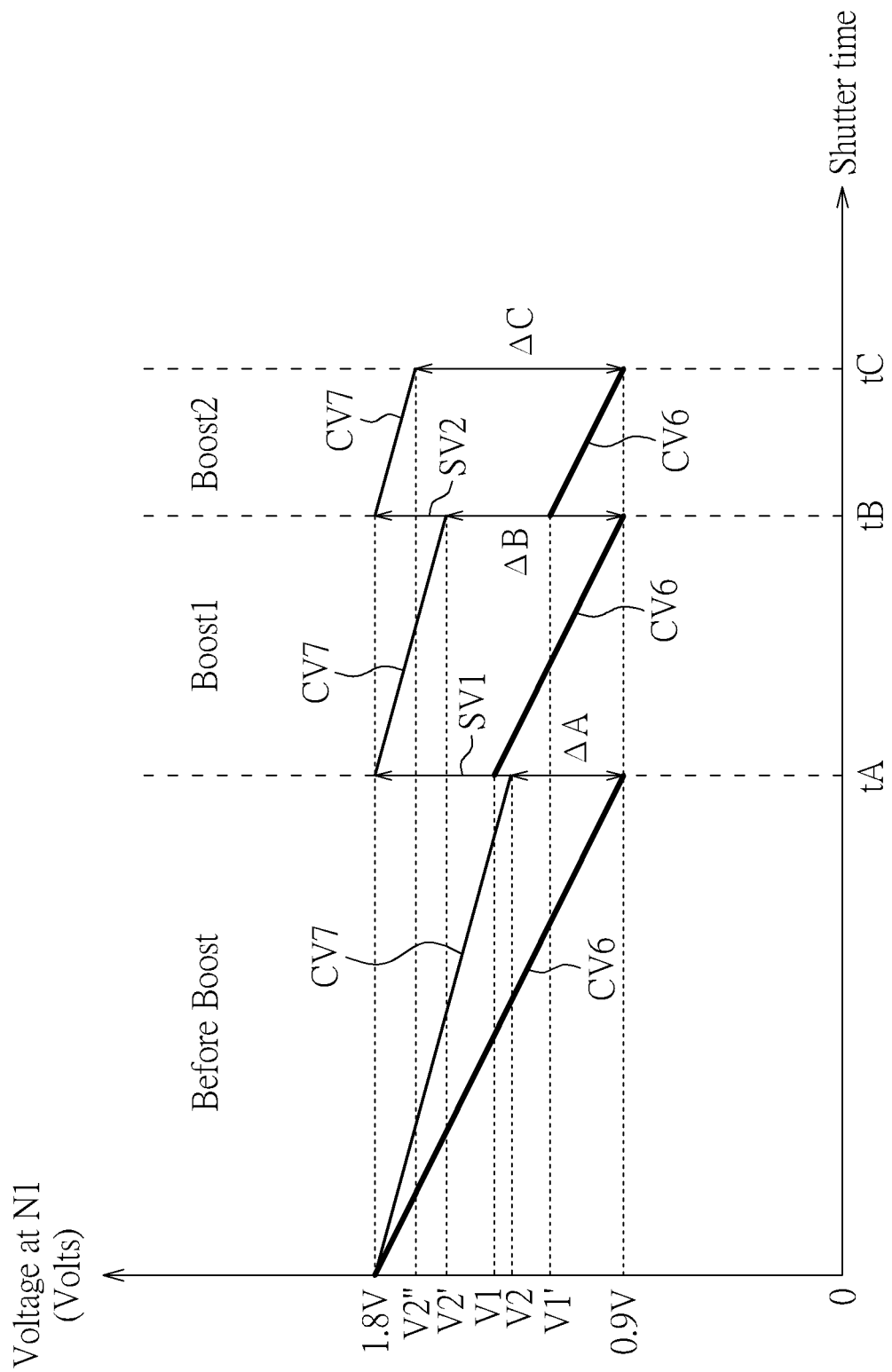
FIG. 3 is a diagram illustrating an example of discontinuously adjusting the adjustable ground levels according to the embodiment of FIG. 1.
Figure 4:
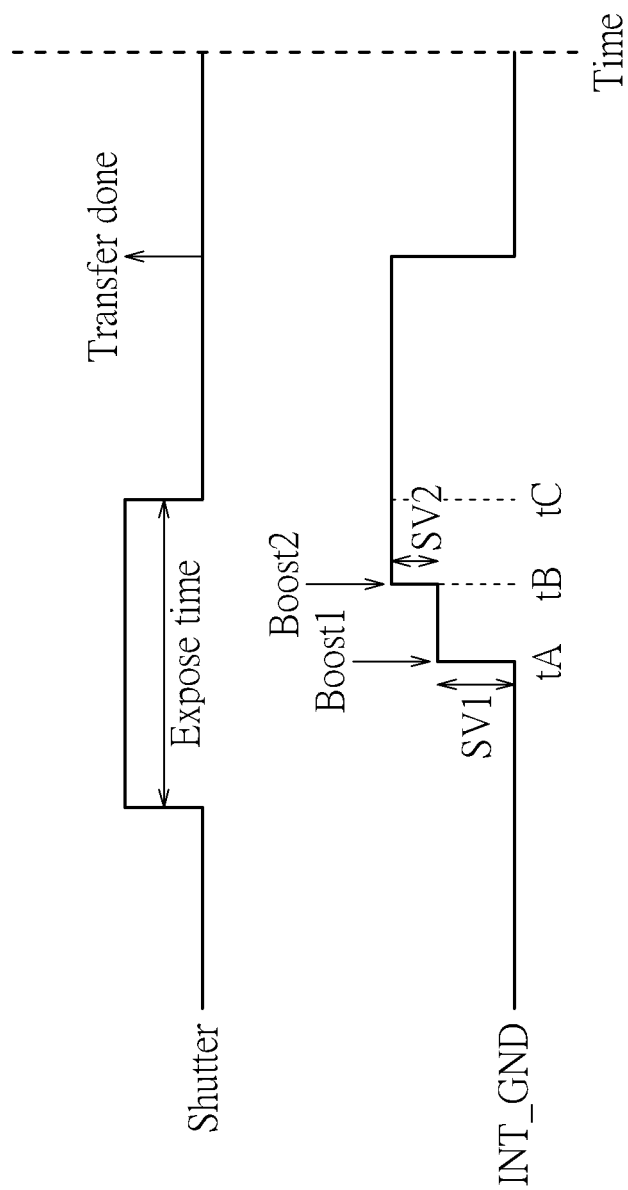
FIG. 4 is an example of the adjustable ground level INT_GND for BJT pixel circuits disposed within at least one spatial region/portion/area of a frame or for all the BJT pixel circuits disposed of a frame according to the embodiment of FIG. 3.

Refer to FIG. 3 in conjunction with FIG. 4. FIG. 3 is a diagram illustrating an example of discontinuously adjusting the adjustable ground levels according to the embodiment of FIG. 1. FIG. 4 is an example of the adjustable ground level INT_GND for BJT pixel circuits disposed within at least one spatial region/portion/area of a frame or for all the BJT pixel circuits disposed of a frame according to the embodiment of FIG. 3. It is noted that the adjustable ground level INT_GND may mean one, more, or all of the adjustable ground levels AGL_11, . . . , AGL_1M, . . . , AGL_N1, . . . , and AGL_NM in different embodiments. As shown in FIG. 3, for a local or global group of BJT pixel circuits, the controlling circuit 110 for example may be arranged to boost or increase the adjustable ground levels INT_GND of the group of BJT pixel circuits for two times (but not limited). For example, the controlling circuit 110 at time to instantly boosts the adjustable ground levels INT_GND with a specific voltage difference SV1 (the voltage adjustment amount is shown in FIG. 4) from zero volts up to the level SV1, so that the voltage level at terminal N1 of the storage capacitor C1 of a second BJT pixel circuit illuminated by the reflected light having the minimum light intensity is boosted from the voltage level V2 to the 1.8 Volts (but not limited) at time tA as shown in FIG. 3 and the voltage level at terminal N1 of the storage capacitor C1 of a first BJT pixel circuit illuminated by the reflected light having the maximum light intensity is boosted from the voltage level 0.9 Volts (but not limited) to the voltage level V1 at time tA, as respectively shown by curves CV6 and CV7. During a period between time tA and time tB, the voltage level at terminal N1 of the storage capacitor C1 of the second BJT pixel circuit is slowly decreased due to that the second BJT pixel circuit is illuminated with the minimum light intensity, and becomes the level V2' at time tB. During the period between time tA and time tB, the voltage level at terminal N1 of the storage capacitor C1 of the first BJT pixel circuit is rapidly decreased due to that the first BJT pixel circuit is illuminated with the maximum light intensity, and becomes 0.9 Volts (but not limited) at time tB.

Then, the controlling circuit 110 at time tB instantly boosts the adjustable ground levels INT_GND with another specific voltage difference SV2 (the voltage adjustment amount is shown in FIG. 4) from the level SV1 up to the level SV2, so that the voltage level at terminal N1 of the storage capacitor C1 of the second BJT pixel is boosted from the voltage level V2' to the 1.8 Volts (but not limited) at time tB and the voltage level at terminal N1 of the storage capacitor C1 of the first BJT pixel circuit is boosted from the voltage level 0.9 Volts (but not limited) to the voltage level V1' at time tB, as respectively shown by curves CV6 and CV7. Then, during a period between time tB and time tC, the voltage level at terminal N1 of the storage capacitor C1 of the second BJT pixel circuit is slowly decreased and becomes the level V2" at time tC. During the period between time tB and time tC, the voltage level at terminal N1 of the storage capacitor C1 of the first BJT pixel circuit is rapidly decreased and becomes 0.9 Volts (but not limited) at time tC.

As shown in FIG. 3, the voltage difference between the curve CV6 and curve CV7 becomes larger with the shutter time, for example, ΔA at time tA, ΔB at time tB, and ΔC at time tC. By discontinuously boosting the adjustable ground levels of storage capacitors C1 of the BJT pixel circuits of pixel units disposed in at least one spatial region/portion/area in a frame or of all pixel units in one frame with different/identical voltage differences at different voltage boosting phases for multiple times, the performance of image contrast quality of the image sensor apparatus 100 can be significantly improved and will not be affected by the environment light.

Further, the controlling circuit 110 may determine and adjust the adjustable ground levels with different adjustment amounts simultaneously or at different times. For example, the controlling circuit 110 may boost the adjustable ground levels of a spatial group of pixel units (e.g. the adjustable ground levels AGL_11 to AGL_1M of BJT pixel circuits 115_11 to 115_1M; but not limited) with a first adjustment amount at a first time point, and may boost the adjustable ground levels of a different spatial group of pixel units (e.g. the adjustable ground levels AGL_N1 to AGL_NM of BJT pixel circuits 115_N1 to 115_NM; but not limited) with a second adjustment amount at a second time point; the first adjustment amount may be identical to or different from the second adjustment amount, and the first time point may be identical to or different from the second time point. The adjustment of the adjustable ground levels can be dynamically performed or adjusted by the controlling circuit 110 according to the change of environment light or factors of other light sources. For instance, the controlling circuit 110 may detect and obtain the pixel values (e.g. gray-level values or brightness values) of different spatial groups of pixel units for a single frame (e.g. a previous data frame or a training frame if the image sensor apparatus 100 comprises a data mode and a training mode) or for multiple frames (e.g. previous data frames or training frames) and then may determine the different/identical adjustable ground levels for the different spatial groups of pixel units according to the different/identical statistic results of pixel values (e.g. average pixel values, but not limited) of the different spatial groups of pixel units. For example, if a first BJT pixel circuit and a second BJT pixel circuit are disposed on a first area of the pixel array circuit 105, and a third BJT pixel circuit and a fourth BJT pixel circuit are disposed on a second area of the pixel array circuit 105; the first area is different from the second area and may be separated by another area spatially. Both the first adjustable ground level corresponding to the first storage capacitor within the first BJT pixel circuit and the second adjustable ground level corresponding to the second storage capacitor within the second BJT pixel circuit are boosted by a first voltage difference during the exposure time, and both the third adjustable ground level corresponding to the third storage capacitor within the third BJT pixel circuit and the fourth adjustable ground level corresponding to the fourth storage capacitor within the fourth BJT pixel circuit are boosted by a second voltage difference during the exposure time. The first voltage difference is associated with the second BJT pixel circuit when a light intensity of a light incident on a second photo detector of the second BJT pixel circuit is lower than a light intensity of a light incident on a first photo detector of the first BJT pixel circuit, and is not associated with the light intensity for the third and fourth BJT pixel circuits. The second voltage difference is associated with the fourth BJT pixel circuit when a light intensity of a light incident on a fourth photo detector of the fourth BJT pixel circuit is lower than a light intensity of a light incident on a third photo detector of the third BJT pixel circuit, and is not associated with the light intensity for the first and second BJT pixel circuits. The first voltage difference may be different from the second voltage difference (but not limited).

Further, the operation of adjusting the adjustable ground levels of different spatial groups of pixel units disposed in one frame may be performed by referring to the identical/different lengths of turn-on periods of the shutter circuits SH of the different spatial groups of pixel units, so as to more effectively improve the performance of image contrast quality of frames captured by the image sensor apparatus 100.

Further, in one embodiment, a specific timing at which the voltage boosting operation is performed, e.g. the time to or time tB, may be associated with and mainly determined based on the BJT pixel circuit of the pixel unit which is illuminated by the incident light having the local/global maximum light intensity, and in another embodiment the time tA may be further modified as a timing earlier time tA; this is similar to time tB.

Further, it is noted that in the embodiments the voltage levels at terminals N1 of the storage capacitors C1 are not boosted to be higher than the voltage VDD such as 1.8 Volts (but not limited) since the timing of performing the voltage boosting operation and the voltage adjustment amount can be correspondingly controlled by the controlling circuit 110. However, if in other embodiments the voltage levels at terminals N1 can be boosted to be higher, then the controlling circuit 110 can arranged to perform corresponding controlling operations.

Those skilled in the art will readily observe that numerous modifications and alterations of the device and method may be made while retaining the teachings of the invention.

Accordingly, the above disclosure should be construed as limited only by the metes and bounds of the appended claims.

What is claimed is:

1. A bipolar junction transistor (BJT) pixel circuit, comprising:
   a BJT transistor, having a base coupled to a photo detector, an emitter coupled to a shutter circuit, and a collector coupled to a reference ground level;
   the photo detector, having a first end coupled to the base of the BJT transistor and a second end coupled to the reference ground level, for generating a base current based on a light intensity of a light incident on the photo detector;
   the shutter circuit, coupled to the emitter of the BJT transistor, for controlling an exposure time of the photo detector according to a shutter signal; and
   a storage capacitor, coupled between the shutter circuit and an adjustable ground level different from the reference ground level, for storing image data captured by the photo detector, wherein the adjustable ground level is boosted to be higher than the reference ground level for one or more times during the exposure time;
   wherein both an adjustable ground level corresponding to the storage capacitor of the BJT pixel circuit and another adjustable ground level corresponding to another storage capacitor of another BJT pixel circuit are boosted at a specific timing, which is associated with the BJT pixel circuit when the light intensity of the light incident on the photo detector of the BJT pixel circuit is higher than the light intensity of the light incident on another photo detector of the another BJT pixel circuit.

2. A pixel array circuit, comprising:
   a plurality of BJT pixel circuits as described in claim 1, the plurality of BJT pixel circuits at least comprise a first BJT pixel circuit and a second BJT pixel circuit;
   wherein both a first adjustable ground level corresponding to a first storage capacitor within the first BJT pixel circuit and a second adjustable ground level corresponding to a second storage capacitor within the second BJT pixel circuit are boosted by a first voltage difference during the exposure time; the first voltage difference is associated with the second BJT pixel circuit when a light intensity of a light incident on a second photo detector of the second BJT pixel circuit is lower than a light intensity of a light incident on a first photo detector of the first BJT pixel circuit.

3. The pixel array circuit of claim 2, wherein the first voltage difference is determined based on the second BJT pixel circuit having the light intensity of the light incident on the second photo detector being a minimum light intensity.

4. The pixel array circuit of claim 2, wherein the plurality of BJT pixel circuits further comprise a third BJT pixel circuit, and a fourth BJT pixel circuit; the first BJT pixel circuit and the second BJT pixel circuit are disposed on a first area of the pixel array circuit; the third BJT pixel circuit and the fourth BJT pixel circuit are disposed on a second area of the pixel array circuit; both a third adjustable ground level corresponding to a third storage capacitor within the third BJT pixel circuit and a fourth adjustable ground level corresponding to a fourth storage capacitor within the fourth BJT pixel circuit are boosted by a second voltage difference during the exposure time wherein the second voltage difference being associated with the fourth BJT pixel circuit when a light intensity of a light incident on a fourth photo detector of the fourth BJT pixel circuit is lower than a light intensity of a light incident on a third photo detector of the third BJT pixel circuit; and, the first voltage difference is different from the second voltage difference.

5. The pixel array circuit of claim 4, wherein the first voltage difference is determined by the second BJT pixel circuit having the light intensity of the light incident on the second photo detector being a minimum light intensity in the first area; and, the second voltage difference is determined by the fourth BJT pixel circuit having the light intensity of the light incident on the fourth photo detector being a minimum light intensity in the second area.

6. The pixel array circuit of claim 1, wherein the specific timing is determined based on the BJT pixel circuit having the light intensity of the light incident on the photo detector being a maximum light intensity.

7. An image sensor apparatus, comprising:
   a pixel array circuit, comprising:
      a plurality of bipolar junction transistor (BJT) pixel circuits,
      a BJT pixel circuit comprising:
         a BJT transistor, having a base coupled to a photo detector, an emitter coupled to a shutter circuit, and a collector coupled to a reference ground level;
         the photo detector, having a first end coupled to the base of the BJT transistor and a second end coupled to the reference ground level, for generating a base current based on a light intensity of a light incident on the photo detector;
         the shutter circuit, coupled to the emitter of the BJT transistor, for controlling an exposure time of the photo detector according to a shutter signal; and
         a storage capacitor, coupled between the shutter circuit and an adjustable ground level different from the reference ground level, for storing image data captured by the photo detector; and
   a controlling circuit, coupled to the pixel array circuit, for dynamically adjusting the adjustable ground level of the each BJT pixel circuit for one or more times during the exposure time, wherein the adjustable ground level is boosted to be higher than the reference ground level;
   wherein both an adjustable ground level corresponding to the storage capacitor of the BJT pixel circuit and another adjustable ground level corresponding to another storage capacitor of another BJT pixel circuit are boosted at a specific timing, which is associated with the BJT pixel circuit when the light intensity of the light incident on the photo detector of the BJT pixel circuit is higher than the light intensity of the light incident on another photo detector of the another BJT pixel circuit.

8. The image sensor apparatus of claim 7, wherein the plurality of BJT pixel circuits at least comprise a first BJT pixel circuit and a second BJT pixel circuit; both a first adjustable ground level corresponding to a first storage capacitor within the first BJT pixel circuit and a second adjustable ground level corresponding to a second storage capacitor within the second BJT pixel circuit are controlled by the controlling circuit to be boosted by a first voltage difference during the exposure time; the controlling circuit determines the first voltage difference according to the second BJT pixel circuit when a light intensity of a light incident on a second photo detector of the second BJT pixel circuit is lower than a light intensity of a light incident on a first photo detector of the first BJT pixel circuit.

9. The image sensor apparatus of claim 8, wherein the first voltage difference is determined by the controlling circuit based on the second BJT pixel circuit having the light intensity of the light incident on the second photo detector being a minimum light intensity.

10. The image sensor apparatus of claim 8, wherein the plurality of BJT pixel circuits further comprise a third BJT pixel circuit, and a fourth BJT pixel circuit; the first BJT pixel circuit and the second BJT pixel circuit are disposed on a first area of the pixel array circuit; the third BJT pixel circuit and the fourth BJT pixel circuit are disposed on a second area of the pixel array circuit; both a third adjustable ground level corresponding to a third storage capacitor within the third BJT pixel circuit and a fourth adjustable ground level corresponding to a fourth storage capacitor within the fourth BJT pixel circuit are controlled by the controlling circuit to be boosted by a second voltage difference during the exposure time wherein the second voltage difference is determined by the controlling circuit based on the fourth BJT pixel circuit when a light intensity of a light incident on a fourth photo detector of the fourth BJT pixel circuit is lower than a light intensity of a light incident on a third photo detector of the third BJT pixel circuit; and, the first voltage difference is different from the second voltage difference.

11. The image sensor apparatus of claim 10, wherein the first voltage difference is determined by the controlling circuit based on the second BJT pixel circuit having the light intensity of the light incident on the second photo detector being a minimum light intensity in the first area; and, the second voltage difference is determined by the controlling circuit based on the fourth BJT pixel circuit having the light intensity of the light incident on the fourth photo detector being a minimum light intensity in the second area.

12. The image sensor apparatus of claim 7, wherein the specific timing is determined by the controlling circuit based on the BJT pixel circuit having the light intensity of the light incident on the photo detector being a maximum light intensity.

* * * * *